United States Patent
Zhao

(10) Patent No.: US 10,553,638 B2
(45) Date of Patent: Feb. 4, 2020

(54) RAY DETECTION SUBSTRATE, MANUFACTURING METHOD THEREOF AND RAY DETECTION DEVICE

(71) Applicant: BOE Technology Group Co., Ltd., Beijing (CN)

(72) Inventor: Lei Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/828,611

(22) Filed: Dec. 1, 2017

(65) Prior Publication Data

US 2018/0254301 A1 Sep. 6, 2018

(30) Foreign Application Priority Data

Mar. 2, 2017 (CN) .......................... 2017 1 0120563

(51) Int. Cl.
| | | |
|---|---|---|
| H01L 27/14 | (2006.01) | |
| H01L 29/04 | (2006.01) | |
| H01L 29/15 | (2006.01) | |
| H01L 31/036 | (2006.01) | |
| H01L 27/146 | (2006.01) | |

(Continued)

(52) U.S. Cl.
CPC .. *H01L 27/14663* (2013.01); *H01L 27/14612* (2013.01); *H01L 27/14689* (2013.01); *H01L 27/14698* (2013.01); *H01L 31/022408* (2013.01); *H01L 31/03762* (2013.01); *H01L 31/115* (2013.01); *H01L 31/1804* (2013.01); *H01L 31/1864* (2013.01)

(58) Field of Classification Search
CPC ....... H01L 27/14; H01L 27/144; H01L 31/18; H01L 27/14663; H01L 27/14612; H01L 27/14689; H01L 27/14698; H01L 31/022408; H01L 31/03762; H01L 31/115; H01L 31/1804; H01L 31/1864
USPC .......................................................... 257/72
See application file for complete search history.

(56) References Cited

U.S. PATENT DOCUMENTS

| | | | |
|---|---|---|---|
| 4,295,002 A | 10/1981 | Chappell et al. | |
| 2016/0365381 A1* | 12/2016 | Zhao | ..................... H01L 31/105 |
| 2018/0097138 A1* | 4/2018 | Bedell | .................. H01L 31/076 |

FOREIGN PATENT DOCUMENTS

| | | |
|---|---|---|
| CN | 102891143 A | 1/2013 |
| CN | 103268891 A | 8/2013 |

(Continued)

OTHER PUBLICATIONS

Chinese Office Action for Chinese application No. 201710120563.8 dated Jan. 31, 2018.

*Primary Examiner* — Niki H Nguyen
(74) *Attorney, Agent, or Firm* — Fay Sharpe LLP

(57) ABSTRACT

The present disclosure provides a ray detection substrate, a manufacturing method thereof and a ray detection device, in the field of display technology. The ray detection substrate comprises: a basal substrate, wherein the basal substrate is provided with a photodiode, the photodiode includes two doped layers and an intrinsic layer located between the two doped layers, and an arrangement direction of the two doped layers is parallel with the basal substrate. The present disclosure solves the problems that the X-ray detection device is poor in performance and improves the performance of the X-ray detection device. The present disclosure is applied to a ray detection device.

20 Claims, 7 Drawing Sheets

(51) Int. Cl.
 *H01L 31/115* (2006.01)
 *H01L 31/0224* (2006.01)
 *H01L 31/0376* (2006.01)
 *H01L 31/18* (2006.01)

(56) References Cited

FOREIGN PATENT DOCUMENTS

| CN | 203260580 U | 10/2013 |
| CN | 104681655 A | 6/2015 |
| CN | 104900669 A | 9/2015 |
| CN | 105742386 A | 7/2016 |

* cited by examiner

RAY DETECTION SUBSTRATE, MANUFACTURING METHOD THEREOF AND RAY DETECTION DEVICE

CROSS-REFERENCE TO RELATED APPLICATION

The present application claims priority to Chinese Patent Application No. 201710120563.8, filed with the State Intellectual Property Office on Mar. 2, 2017 and titled "Ray Detection Substrate, Manufacturing Method thereof and Ray Detection Device", which is incorporated herein by reference in its entirety.

TECHNICAL FIELD

The present disclosure relates to the field of display technology, and more particularly to a ray detection substrate, a manufacturing method thereof, and a ray detection device.

BACKGROUND

An X-ray (also called as Roentgen ray) detection device can detect the internal shape and structure of a part to be detected. The X-ray detection device includes an X-ray source, an indirect X-ray detection substrate and a display. When the X-ray detection device is used, the part to be detected may be disposed between the X-ray source and the X-ray detection substrate. The X-ray source can emit X-rays. The X-rays are directed into the X-ray detection substrate after penetrating through the part to be detected. The indirect X-ray detection substrate can generate an electric signal according to the incident X-rays. The generated electric signal is input to the display, such that the display displays an image.

In the related art, the indirect X-ray detection substrate includes a basal substrate. A photodiode is formed on the basal substrate. A scintillation layer further covers the photodiode. The scintillation layer can convert the X-rays directed into the scintillation layer into visible light and direct the visible light into the photodiode. The photodiode can convert the visible light directed therein into an electric signal. Exemplarily, the photodiode includes two doped layers which are laminated and an intrinsic layer. The intrinsic layer is located between the two doped layers. The laminating direction (i.e., the thickness direction of the intrinsic layer) of the two doped layers is perpendicular to the basal substrate.

The larger the thickness of the intrinsic layer (i.e., the distance between the two doped layers) is, the higher the photoelectric conversion efficiency of the photodiode is. Since a thicker photodiode cannot be manufactured on the basal substrate in the related art, and further the indirect X-ray detection substrate containing the thicker intrinsic layer cannot be manufactured, the photoelectric conversion efficiency of the photodiode in the X-ray detection substrate is relatively lower, and the X-ray detection device is poor in performance.

SUMMARY

The present disclosure provides a ray detection substrate, a manufacturing method thereof and a ray detection device, capable of solving the problem that the X-ray detection device is poor in performance. The technical solutions are as follows:

In a first aspect, there is provided a ray detection substrate. The ray detection substrate includes: a basal substrate, wherein the basal substrate is provided with a photodiode thereon, the photodiode includes two doped layers and an intrinsic layer located between the two doped layers, and an arrangement direction of the two doped layers is parallel with the basal substrate.

In some embodiments, the basal substrate provided with the photodiode is provided with a scintillation layer thereon; the basal substrate is provided with an anode pattern and a cathode pattern thereon; and the basal substrate provided with the anode pattern and the cathode pattern is provided with the photodiode; wherein, the two doped layers include a first doped layer and a second doped layer; the number of free electrons in the first doped layer is smaller than that of holes; the number of free electrons in the second doped layer is greater than that of holes; the first doped layer is connected to the cathode pattern; and the second doped layer is connected to the anode pattern.

In some embodiments, an ion doped concentration in a region in the first doped layer close to the cathode pattern is greater than that in a region away from the cathode pattern. That is, the region in the first doped layer close to the cathode pattern is a first region, the region in the first doped layer away from the cathode pattern is a second region, and the ion doped concentration in the first region is greater than that in the second region; and an ion doped concentration in a region in the second doped layer close to the anode pattern is greater than that in a region away from the anode pattern. That is, the region in the second doped layer close to the anode pattern is a third region, a region in the second doped layer away from the anode pattern is a fourth region, and the ion doped concentration in the third region is greater than that in the fourth region.

In some embodiments, the basal substrate is sequentially provided with a source-drain electrode pattern, a source-drain electrode insulating layer, the cathode pattern, the photodiode, an active layer pattern, a gate electrode insulating layer, a gate electrode pattern, a resin encapsulation pattern and the scintillation layer thereon; wherein, a drain electrode pattern in the source-drain electrode pattern is reused as the anode pattern, the active layer pattern is connected to the source-drain electrode pattern via a via-hole in the source-drain electrode insulating layer, and the gate electrode pattern, the source-drain electrode pattern, the active layer pattern, the source-drain electrode insulating layer and the gate electrode insulating layer form a thin film transistor.

In some embodiments, an orthographic projection region of the active layer pattern on the basal substrate is within an orthographic projection region of gate electrode pattern on the basal substrate. That is, the orthographic projection region of the active layer pattern on the basal substrate is a first projection region, the orthographic projection region of the gate electrode pattern on the basal substrate is a second projection region, and the first projection region is located within the second projection region.

In some embodiments, a first direction is parallel with the basal substrate, a thickness of the intrinsic layer in the first direction is a first thickness, a thickness of the first doped layer in the first direction is a second thickness, a thickness of the second doped layer in the first direction is a third thickness, and the first thickness is greater than the second thickness and the third thickness.

In some embodiments, the basal substrate provided with the anode pattern and the cathode pattern is provided with a plurality of the photodiodes.

In some embodiments, the plurality of the photodiodes are sequentially arranged along the arrangement direction of the two doped layers, and adjacent doped layers in any two adjacent photodiodes are the first doped layers or the second doped layers; and the anode pattern includes a plurality of anodes, the cathode pattern includes a plurality of cathodes, the plurality of anodes and the plurality of cathodes are disposed at intervals one by one, and one photodiode is disposed between any two adjacent anode and cathode.

In some embodiments, the basal substrate provided with the anode pattern and the cathode pattern is provided with a first photodiode, a second photodiode and a third photodiode. That is, the plurality of photodiodes include the first photodiode, the second photodiode and the third photodiode; the first photodiode is disposed close to the thin film transistor, the third photodiode is disposed away from the thin film transistor, and the second photodiode is disposed between the first photodiode and the third photodiode; a first doped layer and a second doped layer of the first photodiode are sequentially disposed along a direction toward the second photodiode, a first doped layer and a second doped layer of the second photodiode are sequentially disposed along a direction toward the first photodiode, and a second doped layer and a first doped layer of the third photodiode are sequentially disposed along a direction toward the second photodiode; the plurality of anodes include a first plate electrode, a second plate electrode and a third plate electrode, wherein the first plate electrode is disposed on and parallel with the basal substrate, the second plate electrode and the third plate electrode are both fixedly disposed on the first plate electrode and are both perpendicular to the basal substrate, the second plate electrode is located between the first photodiode and the second photodiode, and the third plate electrode is located on a side of the third photodiode away from the second photodiode and the plurality of cathodes include a fourth plate electrode and a fifth plate electrode, wherein the fourth plate electrode is located on a side of the first photodiode away from the second photodiode, and the fifth plate electrode is located between the second photodiode and the third photodiode.

In some embodiments, the ray detection substrate is a Roentgen ray detection substrate.

In a second aspect, there is provided a method for manufacturing a ray detection substrate. The method includes: forming a photodiode on a basal substrate, wherein the photodiode includes two doped layers and an intrinsic layer located between the two doped layers, and an arrangement direction of the two doped layers is parallel with the basal substrate.

In some embodiments, after forming the photodiode on the basal substrate, the method further includes: forming a scintillation layer on the basal substrate provided with the photodiode; before forming the photodiode on the basal substrate, the method further includes: forming an anode pattern and a cathode pattern on the basal substrate; and forming the photodiode on the basal substrate includes: forming the photodiode on the basal substrate provided with the anode pattern and the cathode pattern; wherein, the two doped layers include a first doped layer and a second doped layer; the number of free electrons in the first doped layer is smaller than that of holes; the number of free electrons in the second doped layer is greater than that of holes; the first doped layer is connected to the cathode pattern; and the second doped layer is connected to the anode pattern.

In some embodiments, forming the photodiode on the basal substrate provided with the anode pattern and the cathode pattern includes: forming an amorphous silicon layer on the basal substrate provided with the anode pattern and the cathode pattern; annealing the basal substrate provided with the amorphous silicon layer; patterning the annealed amorphous silicon layer to obtain an amorphous silicon pattern; adopting an ion injection process to dope the amorphous silicon pattern to obtain the first doped layer and the second doped layer, wherein an undoped part in the amorphous silicon pattern is an intrinsic layer; and applying an activation treatment to the basal substrate provided with the first doped layer, the intrinsic layer and the second doped layer to obtain the photodiode.

In some embodiments, adopting an ion injection process to dope the amorphous silicon pattern to obtain the first doped layer and the second doped layer includes: adopting a lightly-doped and heavily-doped shared ion injection process to dope the amorphous silicon pattern to obtain the first doped layer and the second doped layer; wherein, an ion doped concentration in a region in the first doped layer close to the cathode pattern is greater than that in a region away from the cathode pattern; an ion doped concentration in a region in the second doped layer close to the anode pattern is greater than that in a region away from the anode pattern. That is, the region in the first doped layer close to the cathode pattern is a first region, the region in the first doped layer away from the cathode pattern is a second region, and the ion doped concentration in the first region is greater than that in the second region; and the region in the second doped layer close to the anode pattern is a third region, the region in the second doped layer away from the anode pattern is a fourth region, and the ion doped concentration in the third region is greater than that in the fourth region.

In some embodiments, forming an anode pattern and a cathode pattern on the basal substrate includes: sequentially forming a source-drain electrode pattern, a source-drain electrode insulating layer and the cathode pattern on the basal substrate, wherein a drain electrode pattern in the source-drain electrode pattern is reused as the anode pattern; after forming the photodiode on the basal substrate, the method further includes: sequentially forming an active layer pattern, a gate electrode insulating layer, a gate electrode pattern and a resin encapsulation pattern on the basal substrate provided with the photodiode; and forming a scintillation layer on the basal substrate provided with the photodiode includes: forming the scintillation layer on the basal substrate provided with the active layer pattern, the gate electrode insulating layer, the gate electrode pattern and the resin encapsulation pattern; wherein, the active layer pattern is connected to the source-drain electrode pattern via a via-hole in the source-drain electrode insulating layer, and the gate electrode pattern, the source-drain electrode pattern, the active layer pattern, the source-drain electrode insulating layer and the gate electrode insulating layer form a thin film transistor.

In some embodiments, an orthographic projection region of the active layer pattern on the basal substrate is located within an orthographic projection region of the gate electrode pattern on the basal substrate. That is, the orthographic projection region of the active layer pattern on the basal substrate is a first projection region, the orthographic projection region of the gate electrode pattern on the basal substrate is a second projection region, and the first projection region is located within the second projection region.

The amorphous silicon pattern includes a plurality of amorphous silicon blocks, adopting the ion injection process to dope the amorphous silicon pattern to obtain the first doped layer and the second doped layer, wherein an undoped part of the amorphous silicon pattern is an intrinsic layer, includes: adopting the ion injection process to dope the plurality of amorphous silicon blocks to obtain a plurality of first doped layers and a plurality of second doped layers, wherein an undoped part in each amorphous silicon block is an intrinsic layer; and applying the activation treatment to the basal substrate provided with the first doped layer, the intrinsic layer and the second doped layer to obtain the photodiode includes: applying the activation treatment to the basal substrate provided with the plurality of first doped layers, the plurality of intrinsic layers and the plurality of second doped layers to obtain the plurality of photodiodes.

In some embodiments, the plurality of photodiodes are sequentially arranged along the arrangement direction of the two doped layers, and adjacent doped layers in any two adjacent photodiodes are the first doped layers or the second doped layers; and the anode pattern includes a plurality of anodes, the cathode pattern includes a plurality of cathodes, the plurality of anodes and the plurality of cathodes are disposed at intervals one by one, and one photodiode is disposed between any two adjacent anode and cathode.

In some embodiments, the amorphous silicon pattern includes three amorphous silicon blocks, adopting the ion injection process to dope the amorphous silicon pattern to obtain the first doped layer and the second doped layer includes: adopting the ion injection process to dope the three amorphous silicon blocks to obtain three first doped layers and three second doped layers, wherein an undoped part in each amorphous silicon block is an intrinsic layer; applying the activation treatment to the basal substrate provided with the first doped layer, the intrinsic layer and the second doped layer includes: applying an activation treatment to the basal substrate provided with the three first doped layer, three intrinsic layer and the three second doped layer to obtain a first photodiode, a second photodiode and a third photodiode; that is, the plurality of first doped layers include three first doped layers, the plurality of second doped layers include three second doped layers and the plurality of photodiodes include a first photodiode, a second photodiode and a third photodiode; the first photodiode is disposed close to the thin film transistor, the third photodiode is disposed away from the thin film transistor, and the second photodiode is disposed between the first photodiode and the third photodiode; the first doped layer and the second doped layer of the first photodiode are sequentially disposed along a direction toward the second photodiode, the first doped layer and the second doped layer of the second photodiode are sequentially disposed along a direction toward the first photodiode, and the second doped layer and the first doped layer of the third photodiode are sequentially disposed along a direction toward the second photodiode; and the plurality of anodes include a first plate electrode, a second plate electrode and a third plate electrode, wherein the first plate electrode is disposed on and parallel with the basal substrate, the second plate electrode and the third plate electrode are both fixedly disposed on the first plate electrode and are both perpendicular to the basal substrate, the second plate electrode is located between the first photodiode and the second photodiode, and the third plate electrode is located on a side of the third photodiode away from the second photodiode; and the plurality of cathodes include a fourth plate electrode and a fifth plate electrode, wherein the fourth plate electrode is located on a side of the first photodiode away from the second photodiode, and the fifth plate electrode is located between the second photodiode and the third photodiode.

In a third aspect, there is provided a ray detection device. The ray detection device include the ray detection substrate described in the first aspect.

The technical solutions provided by the present disclosure may bring the following advantageous benefits:

The photodiode provided on basal substrate include two doped layers and an intrinsic layer. The arrangement direction of the two doped layers (i.e., the thickness direction of the intrinsic layer) is parallel with the basal substrate. When the photoelectric conversion efficiency of the photodiode needs to be improved, the arrangement of a larger thickness of the intrinsic layer will not affect the integral thickness of the photodiode on the basal substrate since the thickness direction of the intrinsic layer is parallel with the basal substrate. Therefore, when the ray detection substrate is manufactured, the photodiode with a thicker intrinsic layer may be disposed on the basal substrate, such that the performance of the ray detection device where the ray detection substrate is disposed is better.

BRIEF DESCRIPTION OF THE DRAWINGS

To describe the technical solutions in the embodiments of the present disclosure more clearly, the following briefly introduces the accompanying drawings that illustrate aspects of the various embodiments. The accompanying drawings in the following description show some embodiments of the present disclosure, and a person of ordinary skill in the art may readily derive other drawings from these accompanying drawings.

FIG. 1-2 is a schematic view of a partial structure of a ray detection substrate provided in an embodiment of the present disclosure;

FIG. 1-3 is a schematic view of projections of an active layer pattern and a gate electrode pattern provided in an embodiment of the present disclosure;

FIG. 2 is a structural schematic view of another ray detection substrate provided in an embodiment of the present disclosure;

FIG. 3 is a bottom view of a ray detection substrate provided in an embodiment of the present disclosure;

FIG. 7-1 is a schematic view of a partial structure of a ray detection substrate provided in an embodiment of the present disclosure;

FIG. 7-2 is a schematic view of a partial structure of another ray detection substrate provided in an embodiment of the present disclosure;

FIG. 7-3 is a schematic view of a partial structure of a further ray detection substrate provided in an embodiment of the present disclosure;

FIG. 7-4 is a schematic view of a partial structure of a still further ray detection substrate provided in an embodiment of the present disclosure;

FIG. 7-5 is a schematic view of a partial structure of a ray detection substrate provided in an embodiment of the present disclosure.

DETAILED DESCRIPTION OF THE EMBODIMENTS

In order to clarify the objects, technical solutions and advantages of the present disclosure, the embodiments of the present application will be further described in detail with reference to the accompanying drawings.

Figure 1:
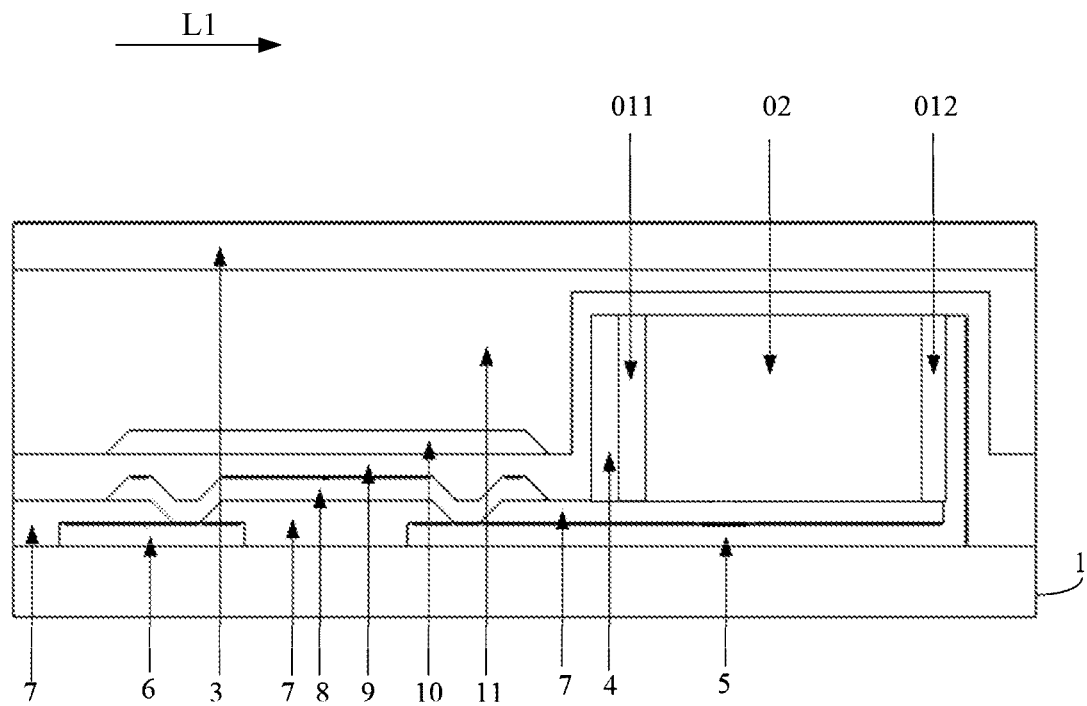
FIG. 1-1 is a structural schematic view of a ray detection substrate provided in an embodiment of the present disclosure.

FIG. 1-1 is a structural schematic diagram of a ray detection substrate provided in an embodiment of the present disclosure. As shown in FIG. 1-1, the ray detection substrate may include a basal substrate 1, wherein the basal substrate 1 is provided with a photodiode. The photodiode includes two doped layers and an intrinsic layer 02 located between the two doped layers, and an arrangement direction L1 of the two doped layers is parallel with the basal substrate 1.

Wherein, the two doped layers include a first doped layer 011 and a second doped layer 012. In the first doped layer 011, the number of free electrons is smaller than that of holes (i.e., the first doped layer is a P-type doped layer). In the second doped layer 012, the number of free electrons is greater than that of holes (i.e., the second doped layer is an N-type doped layer).

In conclusion, in the ray detection substrate provided in the present disclosed embodiment, the arrangement direction of the two doped layers disposed on the basal substrate (i.e., the thickness direction of the intrinsic layer) is parallel with the basal substrate. When the photoelectric conversion efficiency of the photodiode needs to be improved, the arrangement of a larger thickness of the intrinsic layer will not affect the integral thickness of the photodiode on the basal substrate since the thickness direction of the intrinsic layer is parallel with the basal substrate. Therefore, when the ray detection substrate is manufactured, a photodiode with a thicker intrinsic layer may be disposed on the basal substrate, such that performance of the ray detection device where the ray detection substrate is disposed is better.

Figures 1, 2:
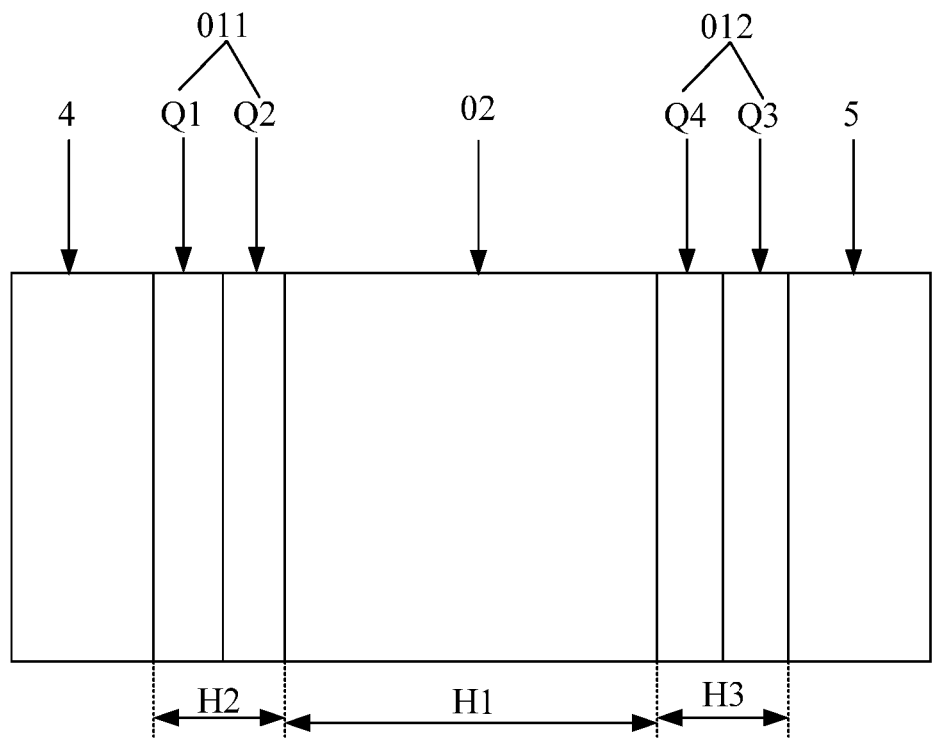

FIG. 1-2 is a schematic diagram of a partial structure of a ray detection substrate provided in the embodiment of the present application. As shown in FIG. 1-2, a first direction L2 is parallel with the basal substrate (the first direction L2 is also parallel with the arrangement direction L1 of the two doped layers in FIG. 1-1). A thickness of the intrinsic layer 02 in the first direction L2 is a first thickness H1. A thickness of the first doped layer 011 in the first direction L2 is a second thickness H2. A thickness of the second doped layer 012 in the first direction L2 is a third thickness H3. The first thickness H1 is greater than the second thickness H2 and the third thickness H3, that is, H1>H2, and H1>H3.

It should be noted that a scintillation layer 3 is disposed on the basal substrate 1 provided with the photodiode. The scintillation layer 3 may be configured to convert X-rays emitted from an X-ray source into visible light, and direct the visible light to be into the photodiode. The photodiode may convert the visible light directed therein into an electric signal and output the same.

Continuing to refer to FIG. 1-1, the basal substrate 1 is further provided with a cathode pattern 4 and an anode pattern 5, which are formed in the same layer. The basal substrate 1 provided with the cathode pattern 4 and the anode pattern 5 is provided with the photodiode. The first doped layer 011 is connected to the cathode pattern 4, and the second doped layer 012 is connected to the anode layer 5. When the operation of the photodiode needs to be controlled, voltage can be input to the second doped layer 012 and the first doped layer 011 in the photodiode through the anode pattern 5 and the cathode pattern 4, respectively.

In some embodiments, in the first doped layer 011, an ion doped concentration in a region close to the cathode pattern 4 may be greater than that in a region away from the cathode pattern 4. In the second doped layer 012, the ion doped concentration in a region close to the anode pattern 5 may be greater than that in a region away from the anode pattern 5. Exemplarily, referring to FIG. 1-2, the region in the first doped layer 011 close to the cathode pattern 4 is a first region Q1, the region in the first doped layer 011 away from the cathode pattern 4 is a second region Q2, and the ion doped concentration in the first region Q1 may be greater than that in the second region Q2. The region in the second doped layer 012 close to the anode pattern 5 is a third region Q3, the region in the second doped layer 012 away from the anode pattern 5 is a fourth region Q4, and the ion doped concentration in the third region Q3 is greater than that in the fourth region Q4.

That is, in the doped layer of the photodiode, the ion doped concentration in the region close to an electrode is greater than that in the region away from the electrode. In a heavily-doped region (with the greater ion doped concentration), the ohmic contact effect between the doped layer and the electrode is better. In a lightly-doped region (with the lower ion doped concentration), the degree of lattice distortion is lower.

Exemplarily, continuing to refer to FIG. 1-1, the basal substrate 1 is sequentially provided with a source-drain electrode pattern, a source-drain electrode insulating layer 7, the cathode pattern 4, the photodiode, an active layer pattern 8, a gate electrode insulating layer 9, a gate electrode pattern 10, a resin encapsulation pattern 11 and the scintillation layer 3. The source-drain electrode pattern include a source electrode pattern 6 and a drain electrode pattern. The drain electrode pattern is reused as the anode pattern 5 (i.e., the drain electrode pattern and the anode pattern are the same pattern and are both the pattern indicated by number 5 in FIG. 1-1). The active layer pattern 8 is connected to the source-drain electrode pattern via a via-hole in the source-drain electrode insulating layer 7. The gate electrode pattern 10, the source-drain electrode pattern, the active layer pattern 8, the source-drain electrode insulating layer 7 and the gate electrode insulating layer 9 form a thin film transistor. That is, the basal substrate 1 is also provided with the thin film transistor. The thin film transistor is connected to the photodiode, realizing an effect of controlling the operation of the photodiode through the thin film transistor.

Figures 1, 2, 3:
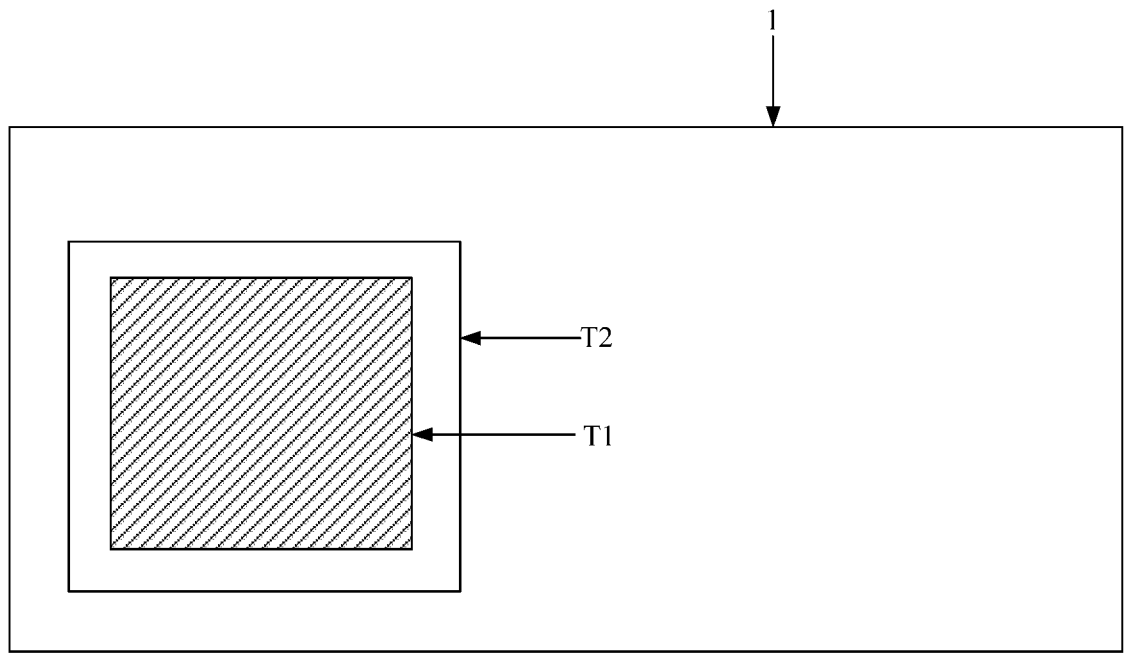
Figure 2:
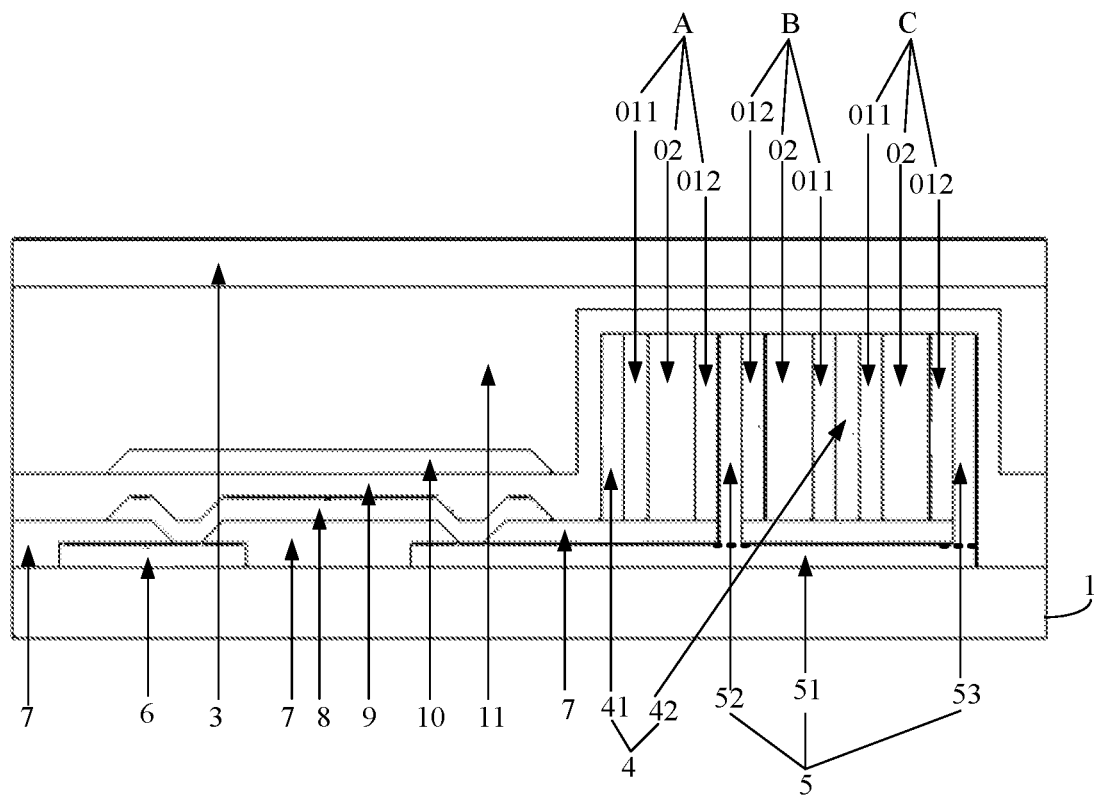
Figure 3:
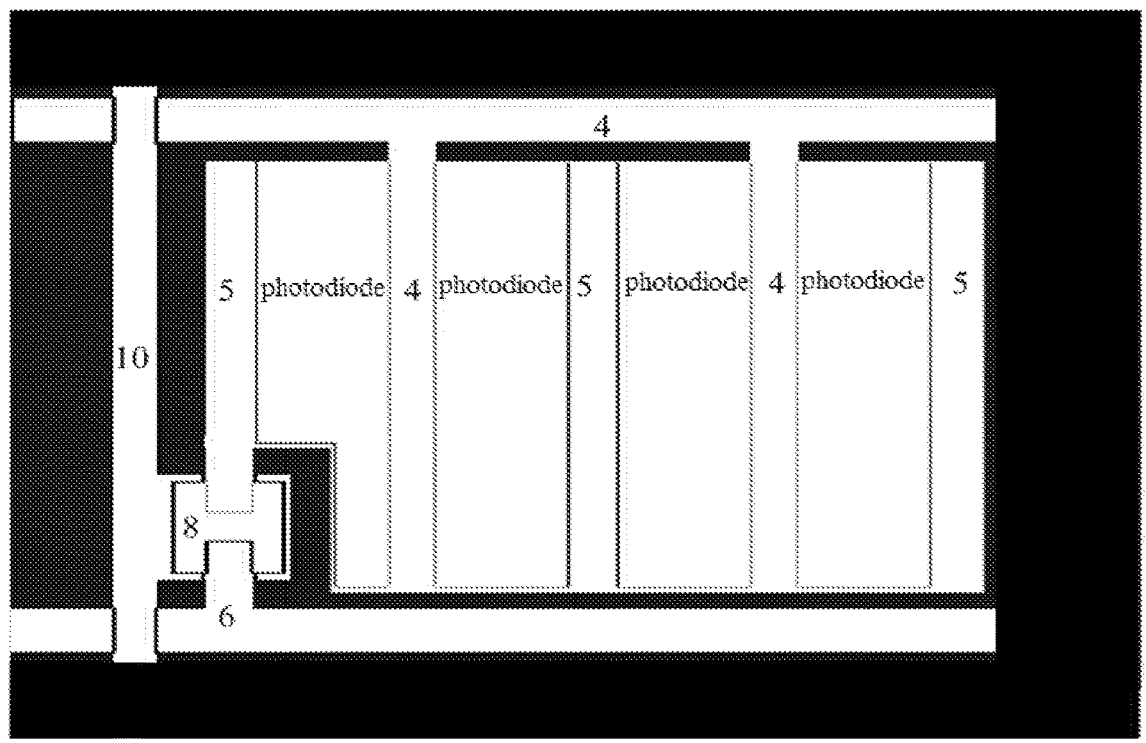

Further, from the ray detection substrate provided by the embodiment of the present disclosure, it can be known that when the ray detection substrate is manufactured, the active layer pattern 8 needs to be formed after the photodiode, to prevent the high temperature activation process applied in manufacturing the photodiode from influencing the performance of the active layer pattern 8. Further, an orthographic projection region of the active layer pattern 8 on the basal substrate 1 is located within an orthographic projection region of the gate electrode pattern 10 on the basal substrate 1. FIG. 1-3 is a schematic diagram of projections of an active layer pattern and a gate electrode pattern provided by an embodiment of the present application. As shown in FIG. 1-3, the orthographic projection region of the active layer pattern on the basal substrate 1 is a first projection pattern T1, the orthographic projection region of the gate electrode pattern 10 on the basal substrate 1 is a second projection pattern T2, and the first projection pattern T1 is located within the second projection pattern T2. That is, the gate electrode pattern 10 is located above the active layer pattern 8, and the gate electrode pattern 10 totally shields the active layer pattern 8, such that the X-rays emitted from the X-ray source will not irradiate the active layer pattern 8, thereby preventing the X rays from influencing the performance of the active layer pattern 8.

It should be noted that the basal substrate 1 in the ray detection substrate provided by the embodiment of the present application may be provided with one or a plurality of photodiodes. When the basal substrate is provided with a plurality of photodiodes, the plurality of photodiodes may be sequentially arranged along the arrangement direction of the two doped layers, and adjacent doped layers in any two adjacent photodiodes are the first doped layers or the second doped layers. The anode pattern may include a plurality of anodes, and the cathode pattern may include a plurality of cathodes. The plurality of anodes and the plurality of cathodes are disposed at intervals one by one, and one photodiode is disposed between any two adjacent anode and cathode.

FIG. 2 is a structural schematic diagram of another ray detection substrate provided by an embodiment of the present disclosure. In FIG. 2, the ray detection substrate is illustrated by taking an example in which the basal substrate 1 is provided with three photodiodes.

As shown in FIG. 2, the basal substrate 1 provided with the cathode pattern 4 and the anode pattern 5 is provided with a first photodiode A, a second photodiode B and a third photodiode C. The first photodiode A is disposed close to the thin film transistor (specifically, close to the active layer pattern in the thin film transistor). The third photodiode C is disposed away from the thin film transistor. The second photodiode B is disposed between the first photodiode A and the third photodiode C. The first photodiode A, the second photodiode B and the third photodiode C are sequentially arranged on the basal substrate along a direction first close to and then away from the thin film transistor.

The first doped layer 011 and the second doped layer 012 of the first photodiode A are sequentially disposed along a direction toward the second photodiode B. The first doped layer 011 and the second doped layer 012 of the second photodiode B are sequentially disposed along a direction toward the first photodiode A. The second doped layer 012 and the first doped layer 011 of the third photodiode C are sequentially disposed along a direction toward the second photodiode B.

Further, the drain electrode (i.e., the anode pattern 5) includes a plurality of anodes. The plurality of anodes include a first plate electrode 51, a second plate electrode 52 and a third plate electrode 53. The first plate electrode 51 is disposed on the basal substrate 1 and parallel with the basal substrate 1. The second plate electrode 52 and the third plate electrode 53 are both fixedly disposed on the first plate electrode 51 and are both perpendicular to the basal substrate 1. The second plate electrode 52 is located between the first photodiode A and the second photodiode B. The third plate electrode 53 is located on a side of the third photodiode C away from the second photodiode B.

The cathode pattern 4 may include a plurality of cathodes. The plurality of cathodes include a fourth plate electrode 41 and a fifth plate electrode 42. The fourth plate electrode 41 is located on a side of the first photodiode A away from the second photodiode B. The fifth plate electrode 42 is located between the second photodiode B and the third photodiode C.

FIG. 3 is a bottom view of a ray detection substrate provided by an embodiment of the present disclosure. It should be noted that FIGS. 1-1 and 2 illustrate sectional views of the ray detection substrate, respectively, while FIG. 3 illustrates the bottom view of the ray detection substrate. The basal substrate of the ray detection substrate in FIG. 3 is provided with four photodiodes in total.

The ray detection substrate provided by the embodiment of the present disclosure may be an X-ray detection substrate. Exemplarily, X-ray detection is widely applied to the fields of medical treatment, safety, nondestructive testing, scientific research, etc., and plays an important role in national interest and people's livelihood. In practice, X-ray detection generally adopts a film radiography method. The X-ray film radiography is higher in imaging quality and can provide reliable information about actual morphology and defect conditions of a tested piece, but it has defects such as complex operation process, high operation cost, difficulty in result saving, inconvenience in inquiry and carrying, easiness of causing highlight damage to eyes of film reading people, etc. In order to solve the above problems, an X-ray detection device using an X-ray digital radiography (DR) detection technology emerged in the late 1990s. Since the pixel element size thereof can be smaller than 0.1 mm, the imaging quality and resolution can nearly compete against the film radiography. Meanwhile, the X-ray digital radiography overcomes the defects in the film radiography, and brings convenience to computer processing on the image. Based on different electronic conversion modes, the digital X-ray radiography detection can be divided into a direct conversion type and an indirect conversion type.

A direct conversion type X-ray plate detection device consists of a ray receiver, a command processor and a power source. The ray receiver contains a scintillation crystal screen, a large-scale amorphous silicon sensor array and a readout circuit, etc. The scintillation crystal screen is configured to convert X-ray photons into visible light. The large-scale integrated amorphous silicon sensor array clinging thereto converts the visible light on the screen into electrons. Then the electrons are digitalized by the readout circuit and are transmitted to a computer to form a displayable digital image.

An indirect X-ray detection device includes an X-ray source, an indirect X-ray detection substrate and a display. The indirect X-ray detection substrate includes a basal substrate. A photodiode is formed on the basal substrate, and a scintillation layer further covers the photodiode. The scintillation layer can convert X-rays directed therein into visible light, and direct the visible light into the photodiode. The photodiode can convert the visible light directed therein into an electric signal. Exemplarily, the photodiode includes two doped layers which are laminated and an intrinsic layer. The intrinsic layer is located between the two doped layers. The laminating direction of the two doped layers (i.e., the thickness direction of the intrinsic layer) is perpendicular to the basal substrate. The X-ray detection device provided by the embodiment of the present disclosure may be an indirect X-ray detection device.

Figure 4:
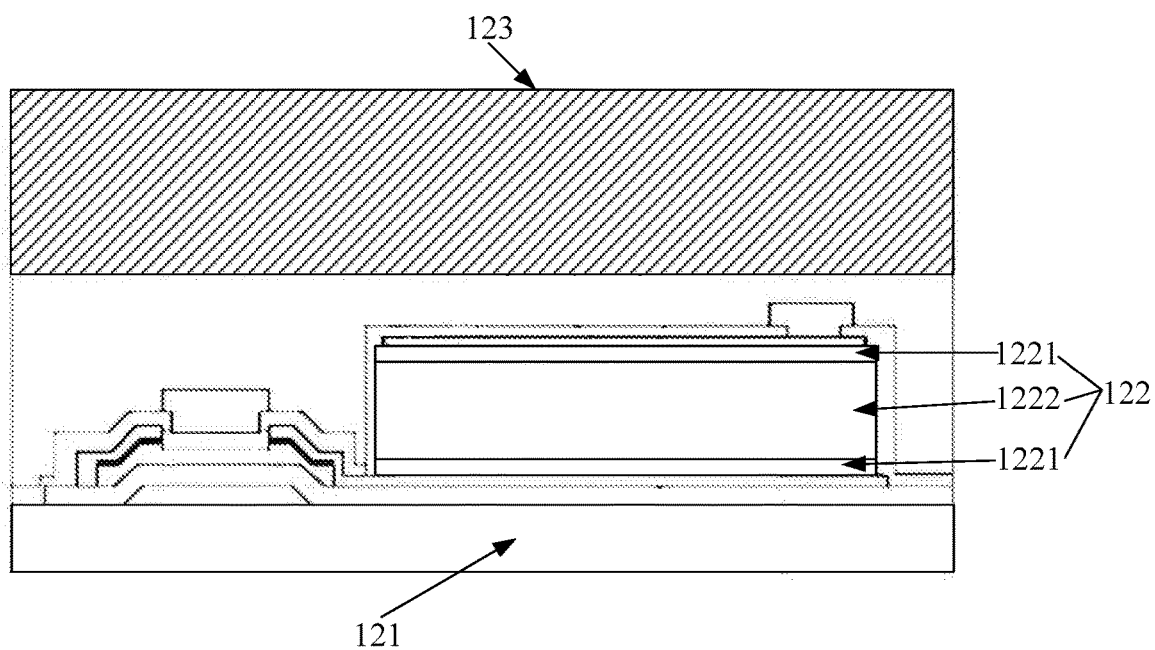
FIG. 4 is a structural schematic view of another ray detection substrate provided in the related art.

FIG. 4 is a structural schematic diagram of a ray detection substrate provided in the related art. As shown in FIG. 4, the ray detection substrate includes a basal substrate 121, wherein the basal substrate 121 is provided with a photodiode 122, and a scintillation layer 123 further covers the photodiode 122. The photodiode 122 includes two doped layers 1221 and an intrinsic layer 1222 located between the two doped layers 1221. The laminating direction of the two doped layers 1221 (i.e., the thickness direction of the intrinsic layer) is perpendicular to the basal substrate 121. The larger the thickness of the intrinsic layer 1222 (i.e., the distance between the two doped layers 1221) is, the higher the photoelectric conversion efficiency of the photodiode 122 is. Since a thicker photodiode 122 cannot be manufactured on the basal substrate 121 in the related art, thus the ray detection substrate containing the thicker intrinsic layer 1222 cannot be manufactured. Therefore, the photoelectric conversion efficiency of the photodiode 122 in the ray detection substrate 12 is lower, and the ray detection device is poor in performance.

As shown in FIG. 1-1 or 2, the intrinsic layer 02 in the photodiode of the embodiment of the present disclosure is disposed between the two doped layers 01 perpendicular to the basal substrate 1, such that the thickness direction of the intrinsic layer 02 is parallel with the basal substrate 1. When the photodiode is disposed on the basal substrate 1, an influence from the manufacturing process of the photodiode is avoided. Therefore, the thicker intrinsic layer can be formed on the basal substrate, thereby improving the photoelectric conversion efficiency of the photodiode disposed on the basal substrate.

Further, when the photoelectric conversion efficiency of the photodiode is higher, the performance of the ray detection device is better. Therefore, the X-ray source in the ray detection device only needs to emit fewer X-rays to realize the image display. Hence, energy consumption of the ray detection device is reduced. Exemplarily, the ray detection substrate provided by the embodiment of the present disclosure may be a Roentgen ray detection substrate, i.e., an X-ray detection substrate.

In conclusion, in the ray detection substrate provided by the embodiment of the present disclosure, the arrangement direction of the two doped layers disposed on the basal substrate (i.e., the thickness direction of the intrinsic layer) is parallel with the basal substrate. When the photoelectric conversion efficiency of the photodiode needs to be improved, the arrangement of a larger thickness of the intrinsic layer will not affect the integral thickness of the photodiode on the basal substrate since the thickness direction of the intrinsic layer is parallel with the basal substrate. Therefore, when the ray detection substrate is manufactured, a photodiode with a thicker intrinsic layer may be disposed on the basal substrate, such that the performance of the ray detection device where the ray detection substrate is disposed is better.

Figure 5:
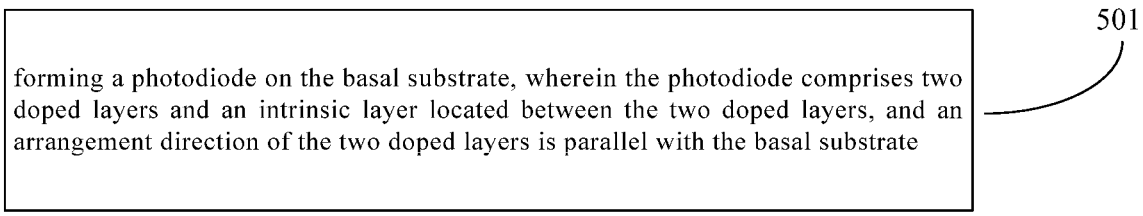
FIG. 5 is a flow chart of a method for manufacturing a ray detection substrate provided in an embodiment of the present disclosure.

FIG. 5 is a flowchart of a method for manufacturing a ray detection substrate provided by an embodiment of the present disclosure. As shown in FIG. 5, the method for manufacturing a ray detection substrate may include:

Step 501: a photodiode is formed on a basal substrate, wherein the photodiode includes two doped layers and an intrinsic layer located between the two doped layers, and an arrangement direction of the two doped layers is parallel with the basal substrate.

In conclusion, in the ray detection substrate manufactured by the manufacturing method provided by the embodiment of the present disclosure, the arrangement direction of the two doped layers disposed on the basal substrate (i.e., the thickness direction of the intrinsic layer) is parallel with the basal substrate. When the photoelectric conversion efficiency of the photodiode needs to be improved, the arrangement of a larger thickness of the intrinsic layer will not affect the integral thickness of the photodiode on the basal substrate since the thickness direction of the intrinsic layer is parallel with the basal substrate. Therefore, when the ray detection substrate is manufactured, a photodiode with a thicker intrinsic layer may be disposed on the basal substrate, such that the performance of the ray detection device where the ray detection substrate is disposed is better.

Figure 6:
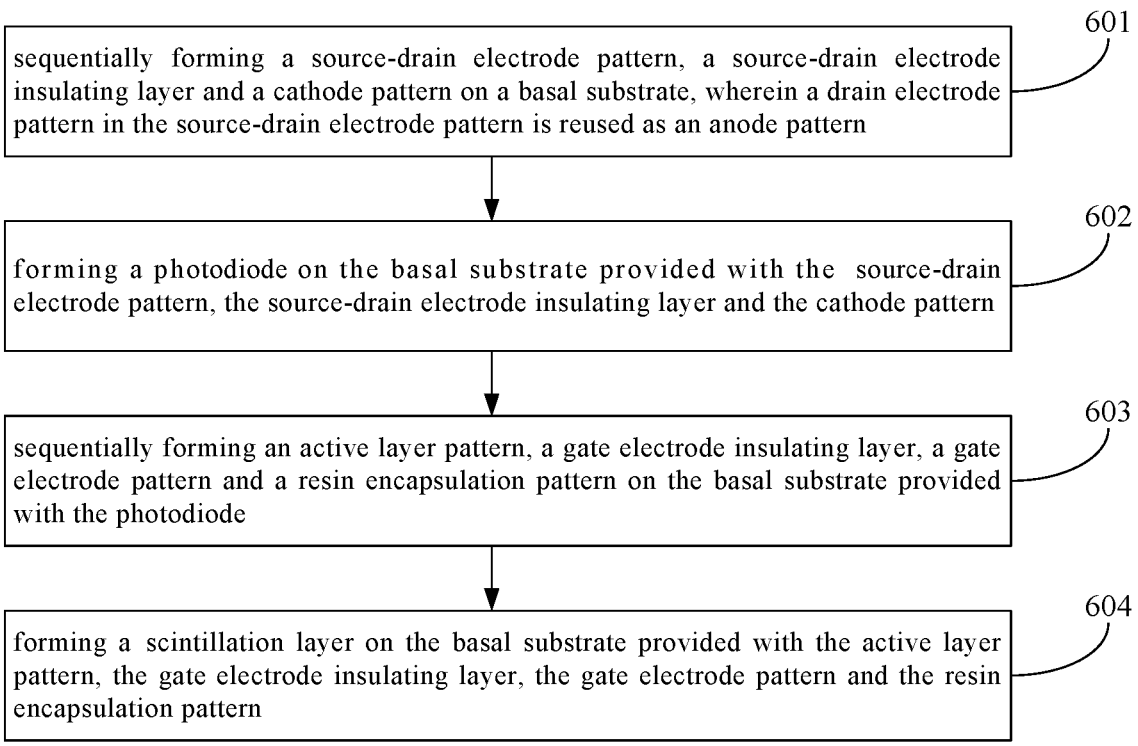
FIG. 6 is a flow chart of a method for manufacturing a ray detection substrate provided in an embodiment of the present disclosure.

FIG. 6 is a flowchart of a method for manufacturing a ray detection substrate provided by an embodiment of the present disclosure. As shown in FIG. 6, the manufacturing method for a ray detection substrate may include:

Step 601: a source-drain electrode pattern, a source-drain electrode insulating layer and a cathode pattern are sequentially formed on the basal substrate, wherein a drain electrode pattern in the source-drain electrode pattern is reused as the anode pattern.

Figures 1, 7:
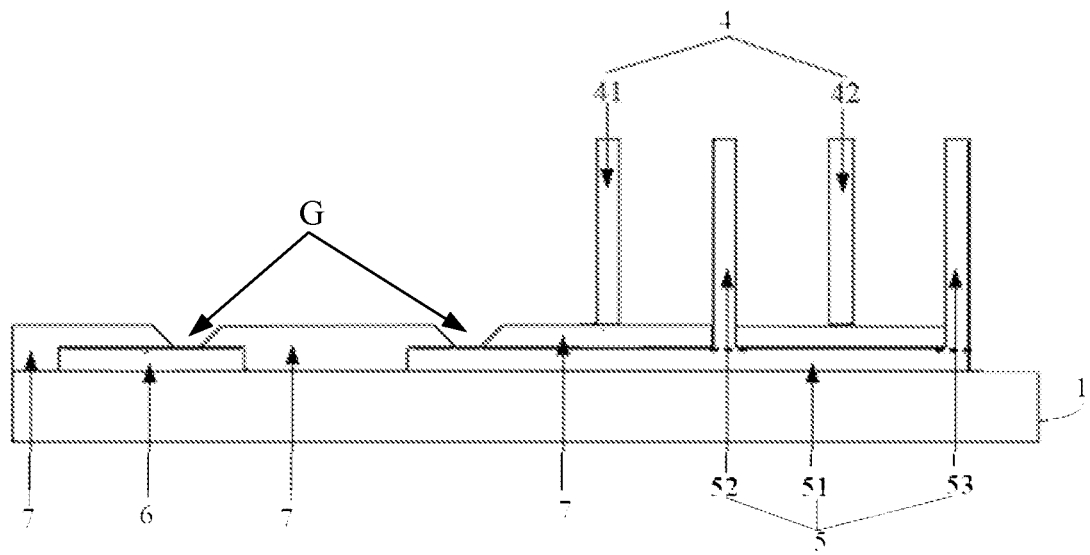
Figures 2, 7:
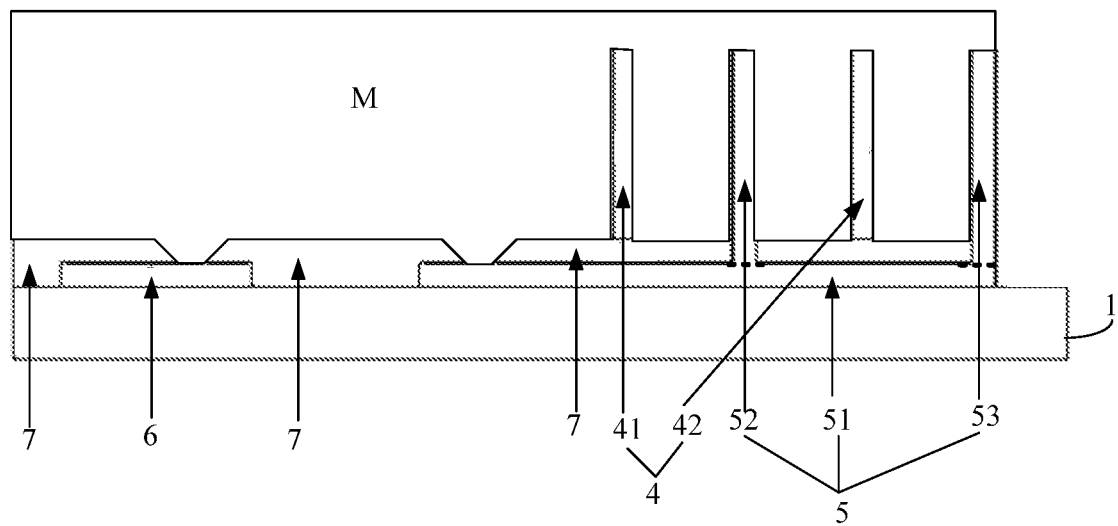
Figures 3, 7:
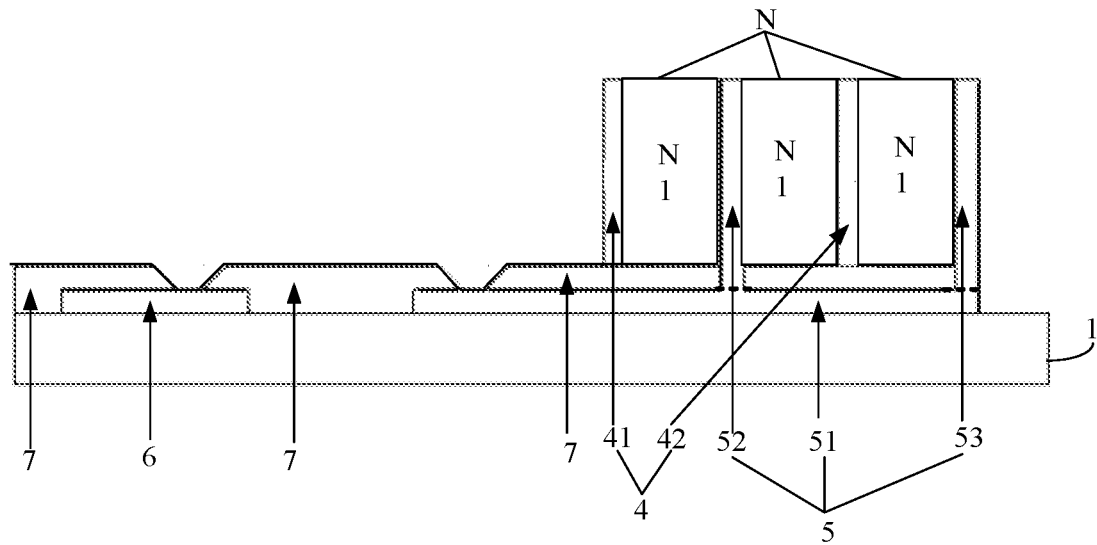
Figures 4, 7:
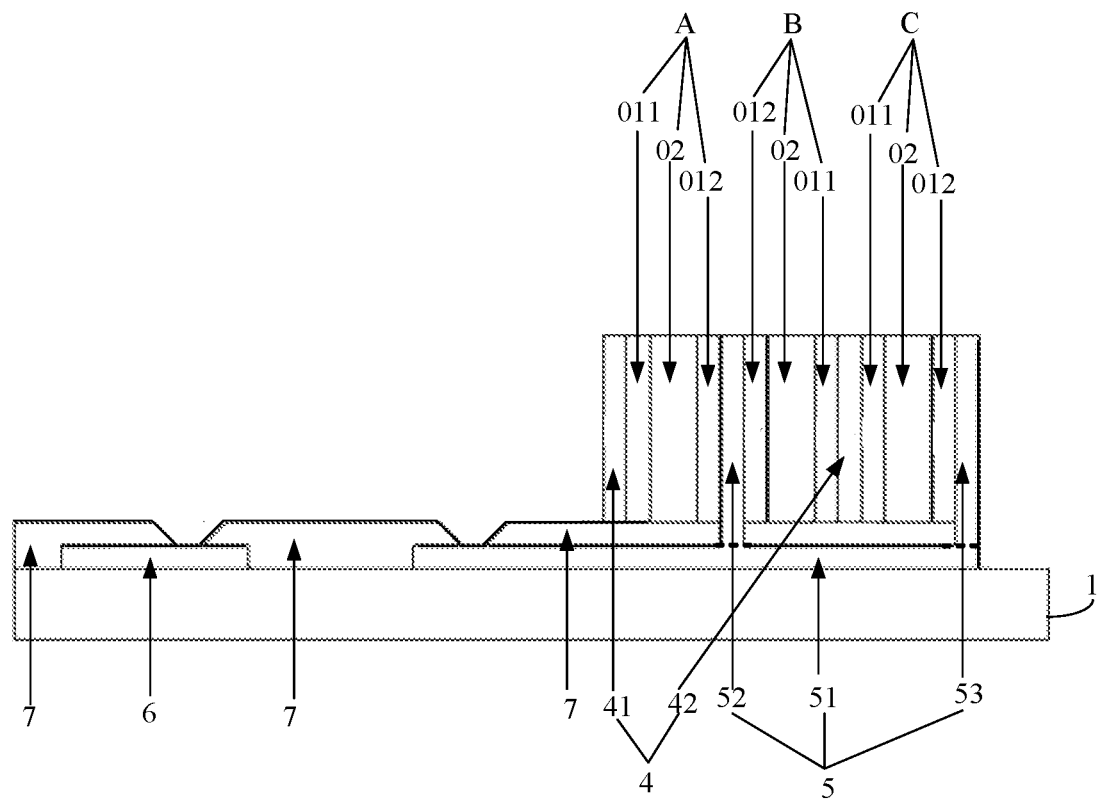
Figures 5, 7:
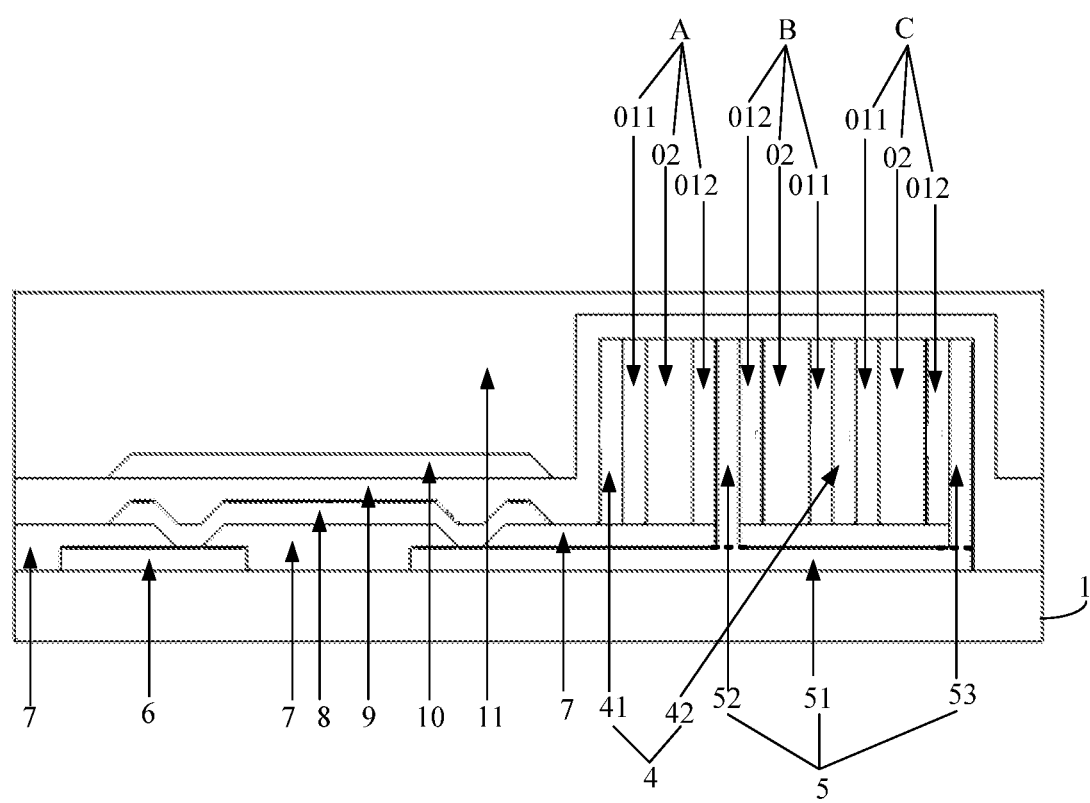

FIG. 7-1 is a schematic diagram of a partial structure of a ray detection substrate provided by an embodiment of the present disclosure. As shown in FIG. 7-1, at step 601, a source-drain electrode material layer may be formed on the basal substrate first by adopting a method such as coating, magnetron sputtering, thermal evaporation or plasma enhanced chemical vapor deposition (PECVD). Then the source-drain electrode material layer is processed by adopting a patterning process to obtain the source-drain pattern as shown in FIG. 7-1, that is, a source electrode pattern 6 and a drain electrode pattern (reused as the anode pattern 5 in FIG. 7-1) are formed on the basal substrate 1. Exemplarily, the shape of the drain electrode pattern may be comb tooth-shaped.

Exemplarily, the source-drain electrode material may be Mo, Al, Ti, Cu, Nd or Nb. A single patterning process may include photoresist coating, exposure, developing, etching and photoresist striping. Therefore, processing the source-drain electrode material layer by adopting the single patterning process includes: coating a layer of photoresist on the source-drain electrode material layer, adopting a mask to expose the photoresist to form a total exposure region and a non-exposure region, adopting the developing process for treatment to remove the photoresist in the total exposure region but reserving the photoresist in the non-exposure region, etching a corresponding region of the total exposure region on the source-drain electrode material layer, and stripping the photoresist in the non-exposure region after the etching.

After the source-drain electrode pattern is formed, the source-drain electrode material layer may be formed on the basal substrate 1 provided with the source-drain electrode pattern by adopting a method such as coating, magnetron sputtering, thermal evaporation or PECVD, and a via-hole G may be formed in the source-drain electrode material layer to obtain the source-drain electrode insulating layer 7 as shown in FIG. 7-1. Finally, the cathode pattern 4 may be formed on the basal substrate 1 provided with the source-drain electrode insulating layer 7. The material of the source-drain electrode insulating layer may be silicon oxide, silicon nitride, silicon oxynitride, aluminum oxide or titanium oxide.

After the source-drain electrode insulating layer is formed, the cathode pattern 41 may be formed on the source-drain electrode insulating layer. The material of the cathode pattern 4 may be same as that of the source-drain electrode pattern. It should be noted that the drain electrode pattern in the source-drain electrode pattern formed at step 601 may be reused as the anode pattern 5 of the photodiode. Exemplarily, the cathode pattern 4 may include a plurality of cathodes. The plurality of cathodes include a fourth plate electrode 41 and a fifth plate electrode 42. The anode pattern 5 includes a plurality of anodes. The plurality of anodes include a first plate electrode 51, a second plate electrode 52 and a third plate electrode 53.

Step 602: a photodiode is formed on the basal substrate provided with the source-drain electrode pattern, the source-drain electrode insulating layer and the cathode pattern.

Exemplarily, the photodiode may include two doped layers and an intrinsic layer located between the two doped layers, and an arrangement direction of the two doped layers is parallel with the basal substrate. In the first doped layer, the number of free electrons is smaller than that of holes. In the second doped layer, the number of free electrons is greater than that of the holes. The first doped layer is connected to the cathode pattern. The second doped layer is connected to the anode pattern.

When the photodiode is formed, as shown in FIG. 7-2, an amorphous silicon layer M may be first formed on the basal substrate 1 provided with the source-drain electrode pattern, the source-drain electrode insulating layer 7 and the cathode pattern 4. Then the basal substrate provided with the amorphous silicon layer M may be annealed (an annealing temperature may be 300° C.~600° C.). The annealed amorphous silicon layer M is patterned to obtain an amorphous silicon pattern N as shown in FIG. 7-3. The amorphous silicon pattern N may include three amorphous silicon blocks N1. Afterwards, the two ends of each amorphous silicon pattern N1 close to an electrode (the electrode in the anode pattern, or the electrode in the cathode pattern) and away from the electrode may be doped by adopting an ion injection process to obtain the first doped layer 011 and the second doped layer 012 as shown in FIG. 7-4.

It should be noted that in a doped process, an undoped part in the amorphous silicon pattern N is the intrinsic layer 02. When the second doped layer containing more electrons is formed through the doping process, hydrogen phosphide gas may be injected into the amorphous silicon layer. When the first doped layer containing more holes is formed through the doping process, hydrogen boride gas may be injected into the amorphous silicon layer. Further, the basal substrate 1 provided with the first doped layer 011, the intrinsic layer 02 and the second doped layer 012 needs to be activated to obtain the photodiode. The activation treatment may be rapid thermal annealing (RTA) or high temperature baking (OVEN), and the activating temperature of the activation treatment may be 350° C.-700° C.

In some embodiments, when the ion injection process is adopted to dope the amorphous silicon pattern, a lightly-doped and heavily-doped shared ion injection process may be adopted to dope the amorphous silicon pattern. In an obtained first doped layer, the ion doped concentration in a region close to the cathode pattern is greater than that in the region away from the cathode pattern. In an obtained second doped layer, the ion doped concentration in a region close to the anode pattern is greater than that in a region away from the anode pattern. That is, in the doped layer of the photodiode, the ion doped concentration in the region close to the electrode is greater than that in the region away from the electrode. In the heavily-doped region (with the higher ion doped concentration), the ohmic contact effect between the doped layer and the electrode is better. In the lightly-doped region (with the lower ion doped concentration), the degree of lattice distortion is lower. In addition, in the embodiment of the present disclosure, adopting the ion injection manner for doping may accurately control the concentration of doped ions.

It should be noted that the basal substrate 1 in the ray detection substrate provided by the embodiment of the present disclosure may be provided with one or a plurality of the photodiodes. The present embodiment is illustrated by taking an example in which the basal substrate 1 is provided with three photodiodes. Exemplarily, the amorphous silicon pattern N in FIG. 7-3 may include three amorphous silicon blocks N1. After the ion injection process is adopted to dope the three amorphous silicon blocks N1, three first doped layers 011 and three second doped layers 012 as shown in FIG. 7-4 can be obtained. The undoped part in each amorphous silicon block N1 is the intrinsic layer 02. After the basal substrate 1 provided with the three first doped layers 011, the three intrinsic layers 02 and the three second doped layers 012 is activated, the first photodiode A, the second photodiode B and the third photodiode C may be obtained.

Step 603: an active layer pattern, a gate electrode insulating layer, a gate electrode pattern and a resin encapsulation pattern are sequentially formed on the basal substrate provided with the photodiode.

After the photodiode is formed on the basal substrate 1, an active material layer may be formed on the basal substrate 1 provided with the photodiode, and then a single patterning process is adopted to process the active material layer to obtain the active layer pattern 8 as shown in FIG. 7-5. Then the gate electrode insulating layer 9 may be formed on the basal substrate 1 provided with the active layer pattern 8 and a gate electrode material layer may be formed on the gate electrode insulating layer 9. The single patterning process is adopted to process the gate electrode material layer to obtain the gate electrode pattern 10 as shown in FIG. 7-5. Finally, a resin layer may be formed on the basal substrate 1 provided with the gate electrode pattern 10 and the single patterning process is adopted to process the resin layer to obtain the resin encapsulation pattern 11.

Wherein, the active layer pattern is connected to the source-drain electrode pattern via a via-hole in the source-drain electrode insulating layer. The gate electrode pattern, the source-drain electrode pattern, the active layer pattern, the source-drain electrode insulating layer and the gate electrode insulating layer form a thin film transistor. That is, the basal substrate 1 is also provided with the thin film transistor, and the drain electrode pattern 5 in the thin film transistor is connected to the photodiode, realizing an effect of controlling the operation of the photodiode through the thin film transistor. Further, the active layer pattern 8 is formed after the photodiode, thereby preventing the high temperature activating process used in manufacturing photodiode from influencing the performance of the active layer pattern 8.

In some embodiments, an orthographic projection region of the active layer pattern 8 on the basal substrate 1 is located within an orthographic projection region of the gate electrode pattern 10 on the basal substrate 1. That is, the gate electrode pattern 10 is located above the active layer pattern 8, and the gate electrode pattern 10 totally shields the active layer pattern 8, such that the X-rays emitted from the X-ray source will not irradiate the active layer pattern 8, thereby preventing the X-rays from influencing the performance of the active layer pattern 8.

In some embodiments, the material of the active layer pattern may be amorphous silicon, low temperature poly-silicon, In—Ga—Zn oxide, In—Ti zinc oxide or zinc oxynitride. The material of the gate electrode insulating layer may be same as that of the source-drain electrode insulating layer. The material of the gate electrode pattern may be same as that of the source-drain electrode pattern.

Step 604: a scintillation layer is formed on the basal substrate provided with the active layer pattern, the gate electrode insulating layer, the gate electrode pattern and the resin encapsulation pattern.

At step 604, the scintillation layer 03 may be formed on the basal substrate provided with the active layer pattern, the gate electrode insulating layer, the gate electrode pattern and the resin encapsulation pattern to obtain the ray detection substrate as shown in FIG. 2. It should be noted that specific steps for forming the scintillation layer 3 may be referenced to related art, and are not repeated in the embodiment of the present disclosure.

The ray detection substrates as shown in FIGS. 2, 7-1, 7-2, 7-3, 7-4 and 7-5 include three photodiodes, i.e. a first photodiode A, a second photodiode B and a third photodiode C, respectively. The first photodiode A is disposed close to the thin film transistor. The third photodiode C is disposed away from the thin film transistor. The second photodiode B is disposed between the first photodiode A and the third photodiode C.

The first doped layer 011 and the second doped layer 012 of the first photodiode A are sequentially disposed along a direction toward the second photodiode B. The first doped layer 011 and the second doped layer 012 of the second photodiode B are sequentially disposed along a direction toward the first photodiode A. The second doped layer 012 and the first doped layer 011 of the third photodiode C are sequentially disposed along a direction toward the second photodiode B.

Further, the anode pattern 5 (i.e., the drain electrode 5) includes a first plate electrode 51, a second plate electrode 52 and a third plate electrode 53. The first plate electrode 51 is disposed on the basal substrate 1 and parallel with the basal substrate 1. The second plate electrode 52 and the third plate electrode 53 are both fixedly disposed on the first plate electrode 51 and are both perpendicular to the basal substrate 1. The second plate electrode 52 is located between the first photodiode A and the second photodiode B. The third plate electrode 53 is located on a side of the third photodiode C away from the second photodiode B. The cathode pattern 4 may include a fourth plate electrode 41 and a fifth plate electrode 42. The fourth plate electrode 41 is located on a side of the first photodiode A away from the second photodiode B. The fifth plate electrode 42 is located between the second photodiode B and the third photodiode C.

In some embodiments, the material of the scintillation layer may be gadolinium oxysulfide, cesium iodide or mercury iodide.

The intrinsic layer in the photodiode of the embodiment of the present disclosure is disposed between the two doped layers perpendicular to the basal substrate, such that the thickness direction of the intrinsic layer is parallel with the basal substrate. When the photodiode is disposed on the basal substrate, an influence from the manufacturing process of the photodiode is avoided. Therefore, a thicker intrinsic layer can be formed on the basal substrate, and further the photoelectric conversion efficiency of the photodiode disposed on the basal substrate is improved. Further, since the performance of the ray detection device is better, the X-ray source in the ray detection device only needs to emit fewer X-rays to realize the image display. Hence, energy consumption of the ray detection device is reduced.

In conclusion, in the ray detection substrate manufactured by the manufacturing method provided by the embodiment of the present disclosure, the arrangement direction of the two doped layers disposed on the basal substrate (i.e., the thickness direction of the intrinsic layer) is parallel with the basal substrate. When the photoelectric conversion efficiency of the photodiode needs to be improved, the arrangement of a larger thickness of the intrinsic layer will not affect the integral thickness of the photodiode on the basal substrate since the thickness direction of the intrinsic layer is parallel with the basal substrate. Therefore, when the ray detection substrate is manufactured, a photodiode with a thicker intrinsic layer can be disposed on the basal substrate, such that the performance of the ray detection device where the ray detection substrate is disposed is better.

The embodiment of the present disclosure provides a ray detection device. The ray detection device include the ray detection substrate as shown in FIG. 1-1, 2 or 3.

Further, the ray detection device may be an X-ray detection device. The X-ray detection device may further include an X-ray source and a display. The X-ray source is used for emitting X-rays to a scintillation layer on the X-ray detection substrate. The display is connected to the ray detection substrate.

In conclusion, in the ray detection substrate in the ray detection device provided by the embodiment of the present disclosure, the arrangement direction of the two doped layers disposed on the basal substrate (i.e., the thickness direction of the intrinsic layer) is parallel with the basal substrate. When the photoelectric conversion efficiency of the photodiode needs to be improved, the arrangement of a larger thickness of the intrinsic layer will not affect the integral thickness of the photodiode on the basal substrate since the thickness direction of the intrinsic layer is parallel with the basal substrate. Therefore, when the ray detection substrate is manufactured, a photodiode with a thicker intrinsic layer can be disposed on the basal substrate, such that the performance of the ray detection device where the ray detection substrate is disposed is better.

The embodiments of the ray detection substrate, of the method for manufacturing the ray detection substrate and of the ray detection device may be referenced to each other, which is not limited in the embodiments of the present disclosure.

The foregoing are alternative embodiments of the present disclosure, and are not intended to limit the present disclosure. Within the spirit and principle of the present disclosure, any modifications, equivalent substitutions, improvements, etc., are within the scope of protection of the present disclosure.

What is claimed is:

1. A ray detection substrate, comprising:
a basal substrate, wherein
the basal substrate is provided with an anode pattern, a cathode pattern, and a photodiode thereon, wherein the photodiode includes two doped layers and an intrinsic layer located between the two doped layers,
the intrinsic layer has a thickness that is a distance between the two doped layers, and a thickness direction of the intrinsic layer is parallel with the basal substrate;
the two doped layers include a first doped layer and a second doped layer; the number of free electrons in the first doped layer is smaller than that of holes in the first doped layer; the number of free electrons in the second doped layer is larger than that of holes in the second doped layer; the first doped layer is connected to the cathode pattern; and the second doped layer is connected to the anode pattern;
a region in the first doped layer close to the cathode pattern is a first region, a region in the first doped layer away from the cathode pattern is a second region, and an ion doped concentration in the first region is larger than that in the second region; and
a region in the second doped layer close to the anode pattern is a third region, a region in the second doped layer away from the anode pattern is a fourth region, and an ion doped concentration in the third region is larger than that in the fourth region.

2. The ray detection substrate according to claim 1, wherein
the basal substrate provided with the photodiode is provided with a scintillation layer thereon.

3. The ray detection substrate according to claim 2, wherein
the basal substrate is sequentially provided with a source-drain electrode pattern, a source-drain electrode insulating layer, the cathode pattern, the photodiode, an active layer pattern, a gate electrode insulating layer, a gate electrode pattern, a resin encapsulation pattern and the scintillation layer thereon;
wherein, a drain electrode pattern in the source-drain electrode pattern is reused as the anode pattern, the active layer pattern is connected to the source-drain electrode pattern via a via-hole in the source-drain electrode insulating layer, and wherein the gate electrode pattern, the source-drain electrode pattern, the active layer pattern, the source-drain electrode insulating layer and the gate electrode insulating layer form a thin film transistor.

4. The ray detection substrate according to claim 3, wherein
an orthographic projection region of the active layer pattern on the basal substrate is a first projection region, an orthographic projection region of the gate electrode pattern on the basal substrate is a second projection region, and the first projection region is located within the second projection region.

5. The ray detection substrate according to claim 3, wherein
a first direction is parallel with the basal substrate, a thickness of the intrinsic layer in the first direction is a first thickness, a thickness of the first doped layer in the first direction is a second thickness, a thickness of the second doped layer in the first direction is a third thickness, and the first thickness is greater than the second thickness and the third thickness.

6. The ray detection substrate according to claim 1, wherein
the ray detection substrate is a Roentgen ray detection substrate.

7. A method for manufacturing a ray detection substrate, comprising:
forming a photodiode on a basal substrate, wherein the photodiode includes two doped layers and an intrinsic layer located between the two doped layers,
the intrinsic layer has a thickness that is a distance between the two doped layers, and a thickness direction of the intrinsic layer is parallel with the basal substrate;
the two doped layers include a first doped layer and a second doped layer; the number of free electrons in the first doped layer is smaller than that of holes in the first doped layer; the number of free electrons in the second doped layer is larger than that of holes in the second doped layer; the first doped layer is connected to a cathode pattern; and the second doped layer is connected to an anode pattern;
a region in the first doped layer close to the cathode pattern is a first region, a region in the first doped layer away from the cathode pattern is a second region, and an ion doped concentration in the first region is larger than that in the second region; and
a region in the second doped layer close to the anode pattern is a third region, a region in the second doped layer away from the anode pattern is a fourth region, and an ion doped concentration in the third region is larger than that in the fourth region.

8. The method according to claim 7, further comprising:
after forming the photodiode on the basal substrate, forming a scintillation layer on the basal substrate provided with the photodiode;
before forming the photodiode on the basal substrate, forming the anode pattern and the cathode pattern on the basal substrate; and
forming the photodiode on the basal substrate includes:
forming the photodiode on the basal substrate provided with the anode pattern and the cathode pattern.

9. The method according to claim 8, wherein forming the photodiode on the basal substrate provided with the anode pattern and the cathode pattern includes:
forming an amorphous silicon layer on the basal substrate provided with the anode pattern and the cathode pattern;
annealing the basal substrate provided with the amorphous silicon layer;
patterning the annealed amorphous silicon layer to obtain an amorphous silicon pattern;
adopting an ion injection process to dope the amorphous silicon pattern to obtain the first doped layer and the second doped layer, wherein an undoped part in the amorphous silicon pattern is an intrinsic layer; and
applying an activation treatment to the basal substrate provided with the first doped layer, the intrinsic layer and the second doped layer to obtain the photodiode.

10. The method according to claim 9, wherein adopting the ion injection process to dope the amorphous silicon pattern to obtain the first doped layer and the second doped layer includes:
adopting a lightly-doped and heavily-doped shared ion injection process to dope the amorphous silicon pattern to obtain the first doped layer and the second doped layer.

11. The method according to claim 9, wherein
forming the anode pattern and the cathode pattern on the basal substrate includes:
sequentially forming a source-drain electrode pattern, a source-drain electrode insulating layer and the cathode pattern on the basal substrate, wherein a drain electrode pattern in the source-drain electrode pattern is reused as the anode pattern;
after forming the photodiode on the basal substrate, the method further comprises:
sequentially forming an active layer pattern, a gate electrode insulating layer, a gate electrode pattern and a resin encapsulation pattern on the basal substrate provided with the photodiode; and
forming a scintillation layer on the basal substrate provided with the photodiode includes:
forming the scintillation layer on the basal substrate provided with the active layer pattern, the gate electrode insulating layer, the gate electrode pattern and the resin encapsulation pattern;
wherein, the active layer pattern is connected to the source-drain electrode pattern via a via-hole in the source-drain electrode insulating layer, and wherein the gate electrode pattern, the source-drain electrode pattern, the active layer pattern, the source-drain electrode insulating layer and the gate electrode insulating layer form a thin film transistor.

12. The method according to claim 11, wherein
an orthographic projection region of the active layer pattern on the basal substrate is a first projection region, an orthographic projection region of the gate electrode pattern on the basal substrate is a second projection region, and the first projection region is located within the second projection region.

13. A ray detection device, comprising a ray detection substrate, wherein the ray detection substrate includes a basal substrate, the basal substrate is provided with a photodiode, a cathode pattern, and an anode pattern, wherein the photodiode includes two doped layers and an intrinsic layer located between the two doped layers,
- the intrinsic layer has a thickness that is a distance between the two doped layers, and a thickness direction of the intrinsic layer is parallel with the basal substrate;
- the two doped layers include a first doped layer and a second doped layer; the number of free electrons in the first doped layer is smaller than that of holes in the first doped layer; the number of free electrons in the second doped layer is larger than that of holes in the second doped layer; the first doped layer is connected to the cathode pattern; and the second doped layer is connected to the anode pattern;
- a region in the first doped layer close to the cathode pattern is a first region, a region in the first doped layer away from the cathode pattern is a second region, and an ion doped concentration in the first region is larger than that in the second region; and
- a region in the second doped layer close to the anode pattern is a third region, a region in the second doped layer away from the anode pattern is a fourth region, and an ion doped concentration in the third region is larger than that in the fourth region.

14. The ray detection substrate according to claim 1, further comprising:
- a scintillation layer, wherein the scintillation layer and the photodiode are provided at a same side of the basal substrate.

15. The method according to claim 7, further comprising:
- forming a scintillation layer on the basal substrate, wherein the scintillation layer and the photodiode are provided at a same side of the basal substrate.

16. The ray detection device according to claim 13, further comprising:
- a scintillation layer, wherein the scintillation layer and the photodiode are provided at a same side of the basal substrate.

17. The ray detection substrate according to claim 3, wherein
- the basal substrate provided with the anode pattern and the cathode pattern is provided with a plurality of the photodiodes.

18. The ray detection substrate according to claim 17, wherein
- the plurality of the photodiodes are sequentially arranged along the arrangement direction of the two doped layers, and adjacent doped layers in any two adjacent photodiodes are the first doped layers or the second doped layers; and
- the anode pattern includes a plurality of anodes, the cathode pattern includes a plurality of cathodes, the plurality of anodes and the plurality of cathodes are disposed at intervals one by one, and one photodiode is disposed between any two adjacent anode and cathode.

19. The ray detection substrate according to claim 18, wherein the plurality of photodiodes include a first photodiode, a second photodiode and a third photodiode,
- the first photodiode is disposed close to the thin film transistor, the third photodiode is disposed away from the thin film transistor, and the second photodiode is disposed between the first photodiode and the third photodiode;
- a first doped layer and a second doped layer of the first photodiode are sequentially disposed along a direction toward the second photodiode, a first doped layer and a second doped layer of the second photodiode are sequentially disposed along a direction toward the first photodiode, and a second doped layer and a first doped layer of the third photodiode are sequentially disposed along a direction toward the second photodiode;
- the plurality of anodes include a first plate electrode, a second plate electrode and a third plate electrode, wherein the first plate electrode is disposed on and parallel with the basal substrate, the second plate electrode and the third plate electrode are both fixedly disposed on the first plate electrode and are both perpendicular to the basal substrate, the second plate electrode is located between the first photodiode and the second photodiode, and the third plate electrode is located on a side of the third photodiode away from the second photodiode; and
- the plurality of cathodes include a fourth plate electrode and a fifth plate electrode, wherein the fourth plate electrode is located on a side of the first photodiode away from the second photodiode, and the fifth plate electrode is located between the second photodiode and the third photodiode.

20. The method according to claim 11, wherein the amorphous silicon pattern includes a plurality of amorphous silicon blocks,
- adopting the ion injection process to dope the amorphous silicon pattern to obtain the first doped layer and the second doped layer, wherein an undoped part of the amorphous silicon pattern is an intrinsic layer, includes: adopting the ion injection process to dope the plurality of amorphous silicon blocks to obtain a plurality of first doped layers and a plurality of second doped layers, wherein an undoped part in each amorphous silicon block is an intrinsic layer; and
- applying the activation treatment to the basal substrate provided with the first doped layer, the intrinsic layer and the second doped layer to obtain the photodiode includes: applying the activation treatment to the basal substrate provided with the plurality of first doped layers, the plurality of intrinsic layers and the plurality of second doped layers to obtain the plurality of photodiodes.

* * * * *